US007754581B2

United States Patent
Ikeda et al.

(10) Patent No.: US 7,754,581 B2
(45) Date of Patent: Jul. 13, 2010

(54) METHOD FOR MANUFACTURING A THREE-DIMENSIONAL SEMICONDUCTOR DEVICE AND A WAFER USED THEREIN

(75) Inventors: Hiroaki Ikeda, Tokyo (JP); Masakazu Ishino, Tokyo (JP); Hiroyuki Tenmei, Tokyo (JP); Naoya Kanda, Tokyo (JP); Yasuhiro Naka, Tokyo (JP); Kunihiko Nishi, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 65 days.

(21) Appl. No.: 11/956,560

(22) Filed: Dec. 14, 2007

(65) Prior Publication Data
US 2008/0164575 A1 Jul. 10, 2008

(30) Foreign Application Priority Data
Dec. 15, 2006 (JP) .............................. 2006-337835

(51) Int. Cl.
*H01L 21/30* (2006.01)
(52) U.S. Cl. ................ 438/455; 438/113; 257/E21.238; 257/E21.567; 257/E21.602
(58) Field of Classification Search ................ 438/113, 438/455; 257/E21.237, E21.238, E21.567, 257/E21.597, E21.599, E21.602, E21.606, 257/E21.607, E21.703
See application file for complete search history.

(56) References Cited

U.S. PATENT DOCUMENTS

| 6,015,652 | A  | * | 1/2000  | Ahlquist et al. | ............. 430/315 |
| 6,174,751 | B1 | * | 1/2001  | Oka             | ............. 438/113 |
| 6,649,445 | B1 | * | 11/2003 | Qi et al.       | ............. 438/108 |
| 7,413,927 | B1 | * | 8/2008  | Patwardhan et al. | ........ 438/108 |
| 2003/0121511 | A1 | * | 7/2003 | Hashimura et al. | ............. 125/2 |
| 2004/0017013 | A1 | * | 1/2004 | Yamaguchi        | ............. 257/778 |
| 2007/0015343 | A1 | * | 1/2007 | Chung et al.     | ............. 438/462 |

FOREIGN PATENT DOCUMENTS

| JP | 11-204939 | 7/1999 |
| JP | 2001-332685 | 11/2001 |
| JP | 2006-261403 | 9/2006 |

* cited by examiner

*Primary Examiner*—Caridad M Everhart
(74) *Attorney, Agent, or Firm*—Young & Thompson

(57) ABSTRACT

A method for manufacturing a semiconductor device includes the steps of forming first and second semiconductor wafers each including an array of chips and elongate electrodes, forming a groove on scribe lines separating the chips from one another; coating a surface of one of the semiconductor wafers with adhesive; bonding together the semiconductor wafers while allowing the groove to receive therein excessive adhesive; and heating the wafers to connect the elongate electrodes of both the semiconductor wafers.

6 Claims, 6 Drawing Sheets

METHOD FOR MANUFACTURING A THREE-DIMENSIONAL SEMICONDUCTOR DEVICE AND A WAFER USED THEREIN

This application is based upon and claims the benefit of priority from Japanese patent application No. 2006-337835, the disclosure of which is incorporated herein in its entirety by reference.

BACKGROUND OF THE INVENTION (a) Field of the Invention

The present invention relates to a method for manufacturing a three-dimensional semiconductor device and a semiconductor wafer suited to the method.

(b) Description of the Related Art

Smaller thickness and planar size of electronic equipment has been achieved mainly by using the parts thereof having smaller dimensions. The microfabrication technology of LSI has largely contributed to the smaller planar size of semiconductor devices used in the electronic equipment However, introduction of a further-advanced microfabrication technology requires a huge amount of investment, and does not satisfy the request for a lower production cost of the semiconductor devices. A three-dimensional mounting technique which stacks a plurality of semiconductor chips in a thickness direction to form a three-dimensional semiconductor device may solve the above technical subject of smaller planar size.

In the three-dimensional mounting technique, penetrating electrodes extending perpendicularly to a semiconductor wafer may be provided for coupling together the semiconductor chips in the thickness direction. The penetrating electrodes are associated with coupling terminals such as pad. electrodes or bumps, which connect together penetrating electrodes of adjacent semiconductor chips. Patent Publication JP-2006-261403A, for example, describes such a three-dimensional mounting technique.

In the three-dimensional mounting technique for the semiconductor device, the fabrication process first prepares a semiconductor wafer on which a plurality of semiconductor chips and penetrating electrodes are formed, pad electrodes and bumps are then formed, followed by separating the wafer into the plurality of chips and stacking the same one on another. The stacking process uses adhesive between the chips for bonding. However, the adhesive may cause the problem of insufficient mechanical force between the stacked chips in the three-dimensional semiconductor device, as will be detailed hereinafter.

First, the adhesive is difficult to spread uniformly around the chips due to a relatively larger planar size of the chips. Second, a smaller height of the coupling terminals, such as bumps, reduces the gap between the stacked chips and prevents the adhesive from spreading uniformly in the gaps. Third, a large number of coupling terminals reduce the horizontal space for introducing the adhesive between the stacked chips, which may incur occurring of a void within the adhesive due to clog of the adhesive.

As a countermeasure for the above problems, it may be considered to form in advance the bumps or pad electrodes on the chips of the wafer, the wafer is then separated into the chips, and the chips are stacked one on another and applied with a higher pressure against one another for electrical and mechanical connection after the chips are coated with the adhesive. Patent Publication JP-1999-204939A, for example, describes a technique for electrical connection using heat and pressure between the chips coated with adhesive after forming the coupling terminals. This technique removes the adhesive from the contact surface of the coupling terminals by the heat and pressure while leaving the adhesive in the other area of the gap between the chips, thereby assuring the electrical connection as well as the mechanical strength.

FIG. 5 shows a conceivable example or comparative example using the above technique in the stacked chips on which smaller-size coupling terminals are formed. In this example, an adhesive layer 16 may be left between the contact surfaces of the coupling terminals due to the smaller size and smaller pitch of the coupling terminals, e.g., between the bumps of the chips. More specifically, the technique described in JP-1999-204939A is not suited to mechanically coupling together the semiconductor chips having smaller-size and smaller-pitch coupling terminals without incurring an insufficient electrical connection.

SUMMARY OF THE INVENTION

In view of the above problem in the comparative example, it is an object of the present invention to provide a method for manufacturing a semiconductor device by using a three-dimensional mounting technique, which is capable of mechanically coupling together semiconductor chips substantially without incurring the problem of insufficient electrical connection therebetween.

It is another object of the present invention to provide a semiconductor wafer used in the above method.

The present invention provides a method for manufacturing a semiconductor device including: forming first and second semiconductor wafers each including therein a plurality of chips and an elongate electrode, the chips being separated from one another by a scribe line; forming a groove on a surface of at least one of the semiconductor wafers along the scribe line; coating the surface of the at least one of the semiconductor wafers or a surface of the other of the semiconductor wafers with first adhesive; bonding together the first and second semiconductor wafers by using the first adhesive while allowing the groove to receive therein excessive adhesive; and connecting together the elongate electrodes of the first and second semiconductor wafers.

The present invention also provides a semiconductor wafer including: a plurality of chips formed on a surface of the semiconductor wafer; a plurality scribe lines formed on the surface to separate the chips from one another; and a groove formed on at least one of the scribe lines.

The above and other objects, features and advantages of the present invention will be more apparent from the following description, referring to the accompanying drawings.

PREFERRED EMBODIMENT OF THE INVENTION

Figure 1A:
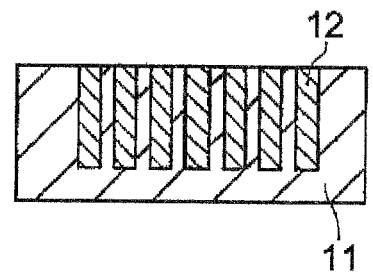
FIGS. 1A to 1G are sectional views of a semiconductor device, consecutively showing steps of a process for manufacturing a semiconductor device according to an embodiment of the present invention.

Now, exemplary embodiments of the present invention will be described with reference to accompanying drawings, wherein similar constituent elements are designated by similar reference numerals throughout the drawings. It is to be noted that the dimensions of each element are not to scale in the drawings.

An anisotropic dry etching process is performed on a surface of a silicon wafer 11, to thereby form elongate holes therein which do not penetrate the silicon wafer. The sidewall of the elongate holes is provided with a thermal oxide film by using a thermal oxidation process. The elongate holes are then filled with polysilicon, as shown in FIG. 1A, to form polysilicon electrodes or elongate electrodes 12, from which penetrating electrodes are to be formed later. Assuming that the semiconductor device to be formed is a DRAM device, the polysilicon electrodes may have a diameter of 20 to 30 micrometers, a length of 50 to 100 micrometers, and an arrangement pitch of 40 to 100 micrometers. These dimensions depend on the fabrication process for the wafer and the type of the semiconductor devices to be formed.

In this example, polysilicon is deposited using a CVD process; however, another conductive material may be deposited using an electroplating process including the steps of forming a power-feed film, electroplating the power-feed film, and polishing the electroplating film, or using nonelectrolytic plating technique including the steps of forming a conductive film, providing catalyst, electroless deposition and surface polishing. The polysilicon is suited to prevention of metallic ions from penetrating through the elongate holes along the penetrating electrodes. An aluminum film is preferably formed on the surface of the polysilicon electrodes 12 for encapsulating the penetrating electrodes within the holes.

Figure 1B:
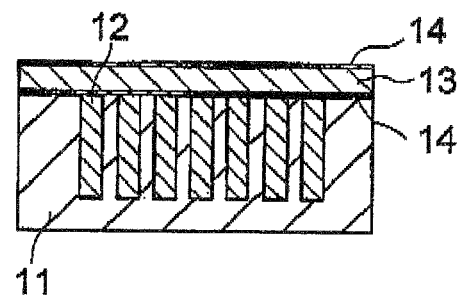

Subsequently, typical processings are performed onto the surface of the semiconductor wafer 10 embedding therein polysilicon electrodes 12, to thereby form an array 13 of semiconductor chips including transistors, interconnections etc. The array 13 of semiconductor chips are covered with an insulating film 14, which may include an inorganic material such as tetraethoxysilane (TEOS) or organic material such as polyimide. Another insulating film 14, such as silicon oxide film, may be interposed between the array 13 of semiconductor chips and the surface of the silicon wafer 11, as shown in FIG. 1B. The insulating films 14 are patterned by etching, to form therein openings for exposing therethrough the front and rear ends of the polysilicon electrodes (penetrating electrodes) 12. The resultant structure is referred to as semiconductor wafer (first semiconductor wafer) 10 in this text.

Figure 1C:
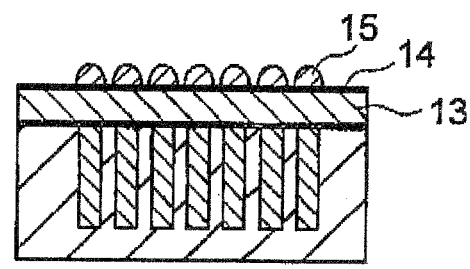

Subsequently, a plurality of bumps having a small size are formed on the respective top ends (front ends) of the polysilicon electrodes 12 as well as interconnections exposed, from the insulating film 14, as shown in FIG. 1C.

Figure 1D:
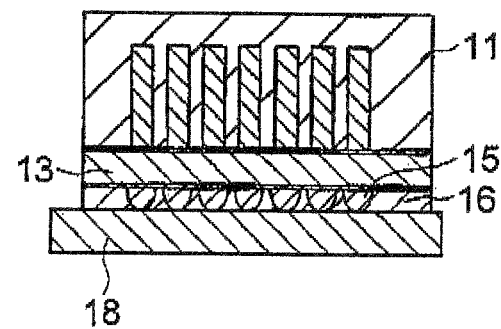
Figure 1E:
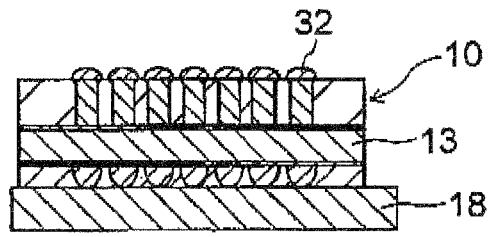

An interposer substrate is separately prepared on which an adhesive layer 16 is formed. The semiconductor wafer 10 is mounted on the interposer substrate 18, as shown in FIG. 1D, so that the small-size bumps 15 are aligned with pad electrodes (not shown) formed on the interposer substrate 18. The resultant structure is then subjected to a pressure together with a heat treatment or ultrasonic treatment, whereby both the semiconductor wafer 10 and interposer substrate 18 are bonded together in this step, the adhesive is eliminated from the contact surface of the bumps 15 and pad electrodes. The rear surface of the semiconductor wafer 10, which is far from the interposer substrate 18, is then polished to expose therethrough rear end of the polysilicon electrodes 12. Subsequently, pad electrodes 32 are formed on the rear end of the polysilicon electrodes 12 thus exposed, as shown in FIG. 1E.

Figure 1F:
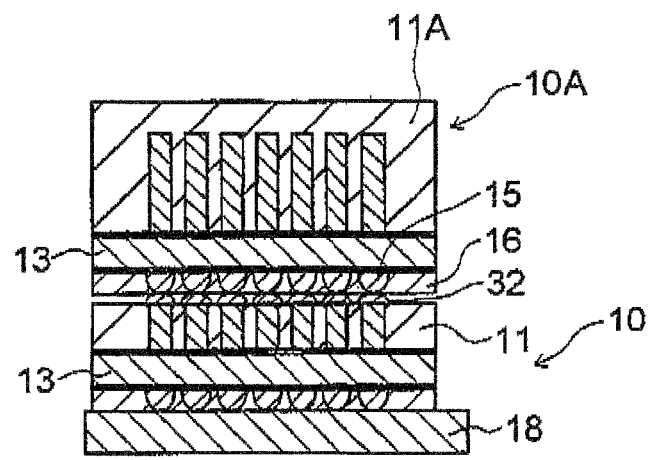

Thereafter, another semiconductor wafer (second semiconductor wafer) 10A is prepared in a process similar to the process for the first semiconductor wafer 10. The front surface of the second semiconductor wafer 10A including surface of the bump electrodes 15 is coated with adhesive, and then contacted with the rear surface of the first semiconductor wafer 10. In this step, the bumps 15 of the second semiconductor wafer 10A are aligned with the respective pad electrodes 32 of the first semiconductor wafer 10. Both the semiconductor wafers 10, 10A are then subjected to a pressure against each other, together with a heat treatment or ultrasonic treatment, whereby the semiconductor wafers 10, 10A are bonded together. The adhesive is eliminated from the contact surface of the bumps 15 and pad electrodes, as shown in FIG. 1F. Thereafter, the rear surface of the second semiconductor wafer 10A is polished to expose therethrough the rear end of the polysilicon electrodes. Third and subsequent silicon wafers are then consecutively mounted onto the second semiconductor wafer 10A by using a similar process, thereby forming layered silicon wafers. A control-chip wafer 20 is finally mounted onto the layered silicon wafers, thereby obtaining the structure shown in FIG. 1G.

Figure 1G:
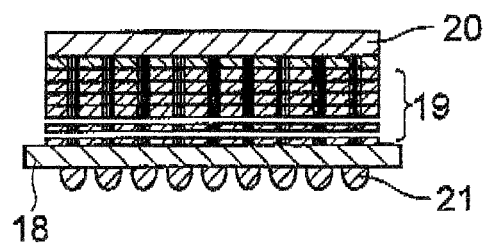

Thereafter, the layered structure of FIG. 1G is separated into a plurality of semiconductor devices each having layered-chip structure or a three-dimensional structure. The resultant semiconductor devices each include a plurality of layered chips 19, a bottom interposer substrate 18 and a top control chip 20. Bumps 21 are formed on the exposed surface of the interposer substrate 18, to thereby obtain the final structure of the three-dimensional semiconductor device. The control chip 20 may be disposed at another position such as between adjacent semiconductor chips or between the semiconductor chip 10 and the interposer substrate 18 other than the top portion, depending on the characteristic and size of the control chip.

Figure 2A:
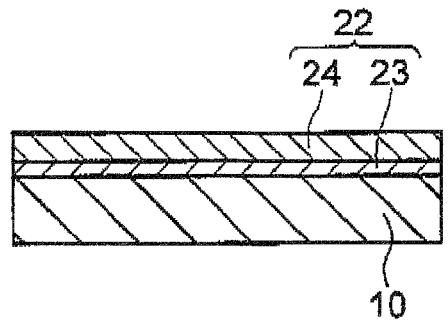
FIGS. 2A to 2F are sectional views of the semiconductor device, consecutively showing detailed steps of the step shown in FIG. 1C.

FIGS. 2A to 2F show detailed steps of the step for forming the bumps 15 shown in FIG. 1C. In each of those drawings, numeral 10 denotes a semiconductor wafer on which the polysilicon electrodes 32 and array of semiconductor chips are formed. A layered power-feed film 22 including titanium layer 23 and copper layer 24 is formed on the semiconductor wafer 10 by using a spattering technique, as shown in FIG. 2A. The titanium layer 23 and copper layer 24 are 50 nm thick and 0.5 micrometer thick, respectively. The titanium layer 23 has a function of improving the adherence between the copper layer 24 and the insulating film such as $SiO_2$, SiN or polyimide film, and thus may have a minimum thickness so long as the function is assured. The thickness of these layers depends on whether or not the process uses sputtering, process condition during the sputtering, and quality of the titanium layer. The titanium layer 23 may be replaced by chromium layer, titanium/platinum layer or tungsten layer etc.

The copper layer 24 preferably has a minimum thickness which assures a uniform thickness distribution of the electroplating film to be formed later. For example, taking into consideration the amount of reduction in the thickness of the electroplating film during acid pickling which may be performed as a pretreatment prior to the electroplating, the thickness of the copper layer 24 is determined so that the thickness does not incur an uneven thickness distribution of the plating tin. A thickness of the copper layer 24 which is excessively larger than the required thickness, such as 1 micrometer, reduces the throughput and thus increases the cost. This may also result in an excessively larger amount of side etching for the copper layer 24 underlying the electroplating tin film 25.

Figure 2B:
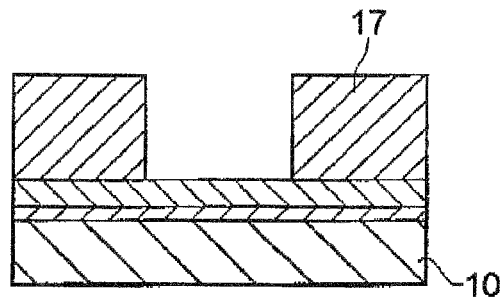

A photoresist film having an array of openings is then formed on the surface of the copper film 24, as shown in FIG. 2B. The resist film may be of any material so long as the resist film has a resistance against the electroplating tin and does not incur any damage on the electroplating tin after removal of the photoresist film. The resist film may be novolac-containing positive resist It is recited in some literature that tin is corroded by strong alkali, and thus it may be considered that if a resist film is configured by a dry film, removal of which generally uses alkali, the electroplating tin will be damaged after the removal of the photoresist film However, according to our experiments, the electroplating tin film was not corroded after immersion of 3%-alkali-hydroxide solution at 45 degrees C. for three minutes. Thus, the resist film may be a dry film. The fact that the electroplating tin film has a resistance against alkali means that the reflow process conducted later does not melt the tin film. It is noted here that the surface of the electroplating tin film may be covered with an oxide film, which may prevent the alkali from melting the electroplating tin film.

Figure 2C:
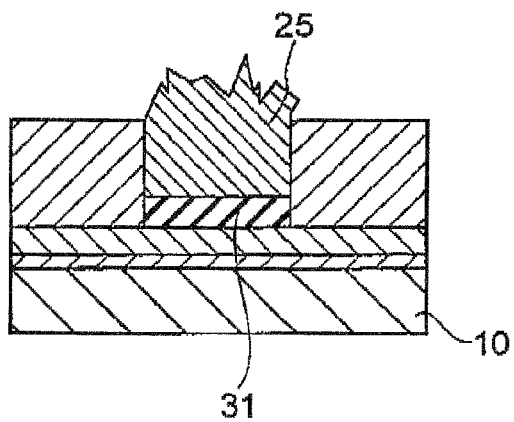

Tin is deposited on a portion of the copper layer 24 exposed from the openings of the resist film 17, by using an electroplating process to form an electroplating tin film 25. In an alternative, the tin film may be formed by solder plating using tin solder including minute amount of silver and/or copper. Although electroplating tin film 25 may be formed directly on the copper layer 24, a nickel film 31 may be preferably used as an underlying film in the view point of reliability, as shown in FIG. 2C.

Figure 2D:
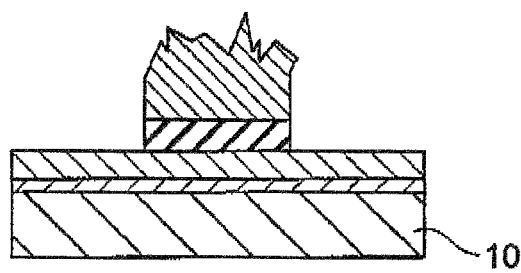

Thereafter, the resist film 17 is removed, as shown in FIG. 2D. The remover may be of any type so long as the remover does not adversely affect the quality of the electroplating tin film 25. An organic solvent such as acetone or butyl acetate may be used as the remover. In addition, a 3%-sodium-hydroxide solution may be used as the remover because the electroplating tin film has a significant resistance against alkali, as recited before.

Figure 2E:
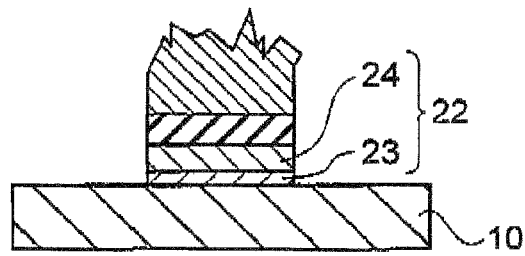

Subsequently, the power-feed film 22 including titanium layer 23 and copper layer 24 is patterned by the wet etching using the electroplating tin film 25 as a mask, to obtain the structure shown in FIG. 2E. The copper layer 24 may be etched using ferric-chloride etching solution or alkali etching solution, such as including ammonia. This etching is performed preferably for 10 seconds or more to assure a suitable control of the etching in the practical view point. However, an excessively long-time etching, such as a time length over five minutes, may incur side etching and longer tact. Thus, the etching condition and etching solution are preferably determined by a suitable experiment. The subsequent etching of the titanium layer 23 of the power-feed film 22 may use an etching solution including hydrogen peroxide as a main component thereof. In each etching, the etching solution is not limited to a particular one so long as the electroplating tin film 25 is not corroded.

Figure 2F:
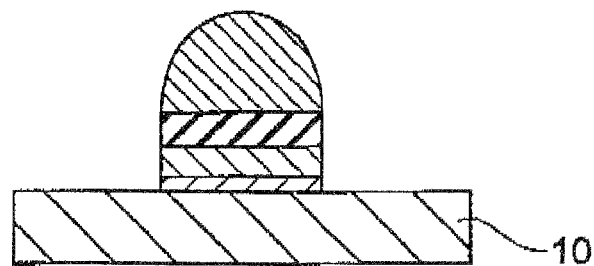

Subsequently, the semiconductor wafer 10 is heated up to a temperature above the melting point of tin, to melt the electroplating tin film 25, thereby obtaining bumps 15 having a semicircular top surface, as shown in FIG. 2F which shows part of FIG. 1C.

Figure 3A:
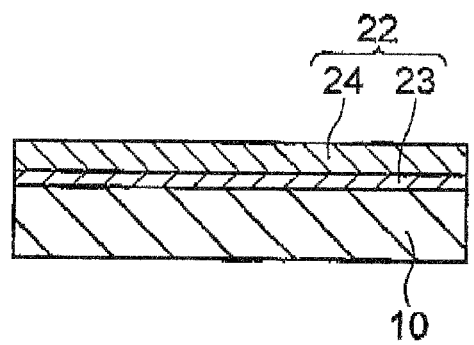
FIG. 3A to 3E are sectional views of the semiconductor device, consecutively showing detailed steps of alternative step of FIG. 1C.
Figure 3B:
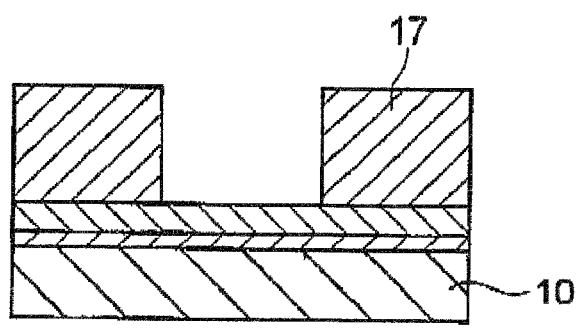

The bumps 15 formed on the array 13 of semiconductor chips shown in FIG. 1C may be replaced by ordinary pad electrodes. FIGS. 3A to 3E show consecutive steps of a process for forming the pad electrodes, instead of the bumps 15. Numeral 10 denotes a semiconductor wafer in which an array of semiconductor chips and polysilicon electrodes are formed. Titanium layer 23 and copper layer 24 are consecutively formed on the semiconductor wafer 10 by sputtering, as shown in FIG. 3A. A photoresist film is then teamed followed by patterning the photoresist film 17 to form a photoresist mask 17 having openings which are similar to the opening for the bumps, as shown in FIG 3B. The material for the resist film is similar to that shown in FIG. 2B.

Figure 3C:
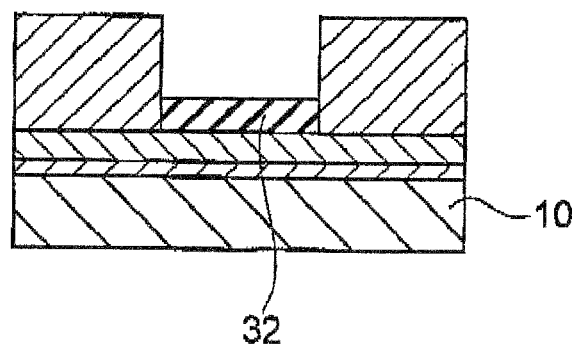
Figure 3D:
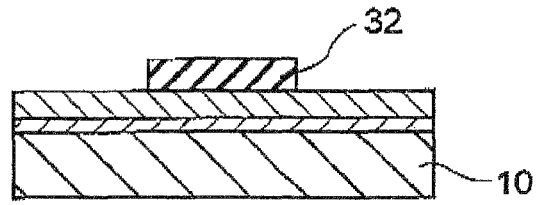

Subsequently, a nickel film is deposited on a portion of the copper film 24 exposed from the openings of the photoresist film 17, as shown in FIG. 3C, to form pad electrodes 32. Pure nickel may be used, or nickel including minute amount of silver and/or copper may be used instead. Thereafter, the photoresist mask 17 is removed, as shown in FIG. 3D. The remover for removing the photoresist mask 17 may be that used for the bumps. For example, an organic solvent such as acetone or butyl acetate may be used as the remover.

Figure 3E:
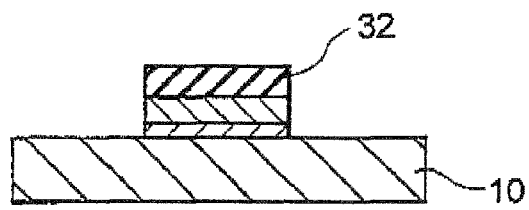

The power-feed film including the titanium layer 23 and copper layer 24 is then patterned using the pad electrodes 32 as an etching mask, as shown in FIG. 3E. The etching of the copper layer 24 may use an etching solution including ferric chloride or alkali etching solution. In this embodiment, an alkali etching solution including ammonia is used. The etching time length is similar to that for the case of bumps.

Figure 4A:
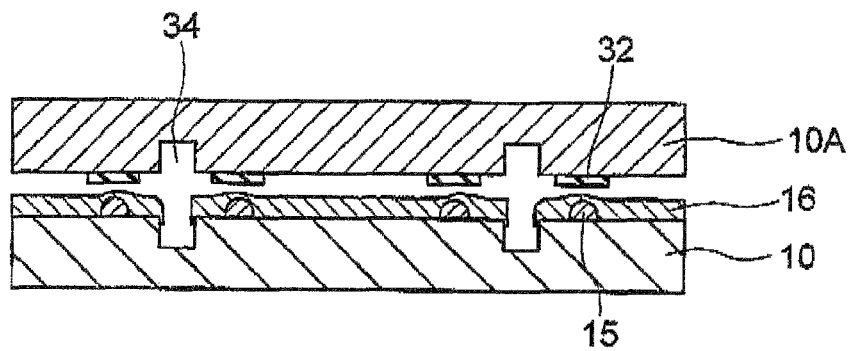
FIG. 4A to 4C are sectional views of the semiconductor device, conventional showing the steps subsequent to step shown in FIG. 1F.
Figure 4B:
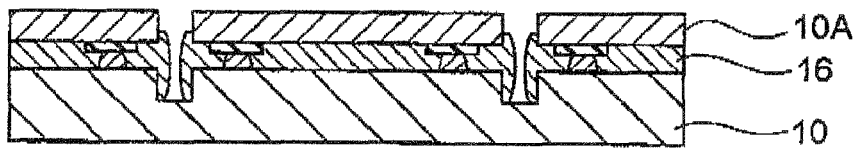
Figure 4C:
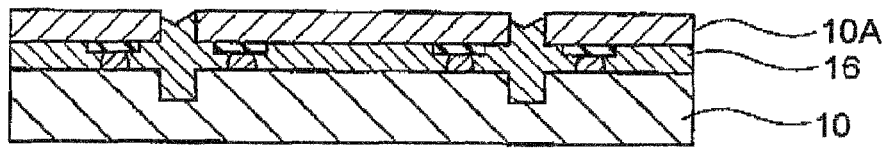
Figure 5:
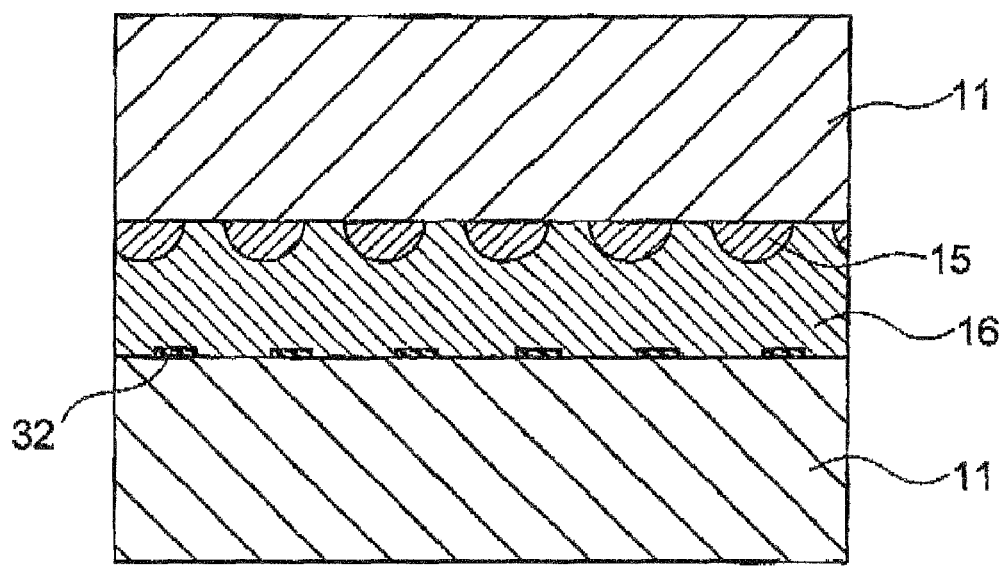
FIG. 5 is a sectional view of a semiconductor device of a comparative example in a step of a process manufacturing the same.

FIGS. 4A to 4C show consecutive steps of the process for forming the layered semiconductor wafers 10, 10A shown in FIG. 1F. In those drawings, the interposer substrate 18 is omitted for depiction, and numerals 10 and 10A denote silicon wafers on which an array of semiconductor chips are formed. Both the semiconductor wafers 10 and 10B on which the bumps 15 and pad electrodes 32 are formed, respectively, include a groove 34 formed by half-cut dicing on the wafer surface along the scribe lines.

The width and depth of groove 34 formed on the scribe lines depend on the size of chips formed on the wafers 10, 10A and the property of the adhesive used in the bonding process, and may be determined by experiments. In the example shown, the half-cut groove 34 are formed on both the semiconductor wafers; however, the grooves may be formed on either one of the wafers. As depicted in FIG. 4A, adhesive is applied to the surface of the first semiconductor wafer 10 on which the bumps 15 are formed, and the second semiconductor wafer 10A is positioned in the close proximity of the surface of the first semiconductor wafer 10 while aligning the pad electrodes 32 with the respective bumps 15. It is to be noted that the adhesive may be applied to any of the wafers 10 and 10A, and that either one of the wafers may be located at the top.

The adhesive is coated uniformly onto the surface of the wafer 10 except for the internal of the groove 34 on the scribe lines. The second wafer 10A is then mounted and pressed onto the first wafer 10 while hearing both the wafers 10 and 10A. The temperature is above the melting point of the bumps 15. The pressure applied to the wafer 10A removes the adhesive from the contact surface of the bumps 15 with respect to the pad electrodes 32, whereby the surface of the bumps 15 is in direct contact with the surface of the pad electrodes 32, to thereby achieve excellent electric coupling, as shown in FIG. 4B. The adhesive layer 16 used herein includes a thermosetting resin, and thus is cured by the heat to mechanically couple together both the wafers 10 and 10A. The bonding of the wafers allows the excessive adhesive to enter the internal of the groove 34 on the scribe lines, whereby the adhesive does not remain on the contact surface of the bumps 15 and pad electrodes 32, as depicted in FIG. 4C.

Thereafter, the rear surface of the second wafer 10A is polished to expose therefrom the rear end of the polysilicon electrodes. Bumps or pad electrodes are then formed on the exposed rear end of the polysilicon electrodes. The polishing of the rear surface allows the bottom of the half-cut groove 34 to be removed, whereby the groove 34 appears on the rear surface of the second semiconductor wafer 10A. Adhesive is then applied onto the rear surface of the second wafer 10A except for the internal of groove 34, and a third wafer having a similar half-cut groove along the scribe lines on the front surface is mounted on the rear surface of the second wafer 10A. Similar bonding is performed using heat and pressure to electrically and mechanically couple the wafers. A control-chip wafer is used as the final wafer. In the above process, introduction of the excessive adhesive into the half-cut groove 34 prevents an uneven distribution of the adhesive in the gap between the wafers, whereby warp of wafers caused by presence of the excessive adhesive can be avoided. It is to be noted that bonding of metallic wafers, if employed, may use an ultrasonic treatment instead of the heat treatment In the above embodiment, bumps 15 are formed by tin plating using pure tin; however, alloy solder including tin at an amount of 90% or above may be used instead. The pad electrodes 32 may be formed from an alloy including nickel at an amount of 90% or above, for example, instead of electo-plating using pure nickel. The bumps may have a diameter of 10 to 100 micrometers, a height of 10 to 100 micrometers, for example.

In the above embodiment, the groove is formed on any of the scribe lines separating the rectangular chips from one another. However, the groove may be formed on some of the scribe lines. For example, the groove may be formed on first scribe lines extending parallel to one another and not formed on second scribe lines extending perpendicularly to the first scribe lines. In addition, the groove may be formed on every other first scribe lines extending parallel to one another.

As described heretofore, the excessive adhesive removed from the vicinity of the contact surface of the coupling electrodes is received in the groove formed on the scribe lines, whereby the present invention suppresses occurring of the malfunction caused by the adhesive remaining on the contact surface of the coupling terminals, and suppresses the malfunction of warp of wafers caused by the excessive adhesive.

While the invention has been particularly shown and described with reference to exemplary embodiment and modifications thereof, the invention is not limited to these embodiment and modifications. It will be understood by those of ordinary skill in the art that various changes in form and details may be made therein without departing from the spirit and scope of the present invention as defined in the claims.

What is claimed is:

1. A method for manufacturing a semiconductor device comprising:
    forming first and second semiconductor wafers each including therein a plurality of chips and an elongate electrode, said chips being separated from one another by a scribe line;
    forming a groove on a surface of at least one of said semiconductor wafers along said scribe line;
    coating said surface of said at least one of said semiconductor wafers or a surface of the other of said semiconductor wafers with first adhesive;
    bonding together said first and second semiconductor wafers by using said first adhesive while allowing said groove to receive therein excessive adhesive; and
    connecting together said elongate electrodes of said first and second semiconductor wafers.

2. The method according to claim 1, wherein said groove forming uses a half-cut dicing technique.

3. The method according to claim 1, wherein said groove has a larger cross-section than said scribe lines.

4. The method according to claim 1, further comprising:
    forming a third semiconductor wafer including therein a plurality of chips and an elongate electrode;
    forming, on a surface of said third said semiconductor wafer, a groove along a scribe line separating said semiconductor chips from one another;
    polishing an exposed surface of one of said first and second semiconductor wafers to expose an end of said elongate electrode;
    forming a coupling terminal on said end of said elongate electrode;
    coating said polished surface or a said surface of said third semiconductor wafer with second adhesive;
    bonding together said third semiconductor wafer and said one of said semiconductor wafers having said exposed surface by using said second adhesive while allowing said groove to receive therein excessive adhesive; and
    connecting together said elongate electrode of said third semiconductor wafer and said coupling terminal.

5. The method according to claim 4, wherein said coupling terminal forming includes electroplating using a dry film to deposit a metallic film.

6. A method for manufacturing a semiconductor device comprising:
    forming first and second semiconductor wafers each including therein a plurality of chips and an elongate electrode, said chips being separated from one another by a scribe line;
    forming a groove on a surface of at least one of said semiconductor wafers along said scribe line;
    coating said surface of said at least one of said semiconductor wafers or a surface of the other of said semiconductor wafers with first adhesive;
    bonding together said first and second semiconductor wafers by using said first adhesive while allowing said groove to receive therein excessive adhesive;
    connecting together said elongate electrodes of said first and second semiconductor wafers;
    forming a third semiconductor wafer including therein a plurality of chips and an elongate electrode;
    forming, on a surface of said third said semiconductor wafer, a groove along a scribe line separating said semiconductor chips from one another;
    polishing an exposed surface of one of said first and second semiconductor wafers to expose an end of said elongate electrode;
    forming a coupling terminal on said end of said elongate electrode;
    coating said polished surface or a said surface of said third semiconductor wafer with second adhesive;
    bonding together said third semiconductor wafer and said one of said semiconductor wafers having said exposed surface by using said second adhesive while allowing said groove to receive therein excessive adhesive; and
    connecting together said elongate electrode of said third semiconductor wafer and said coupling terminal.

* * * * *